United States Patent
Chumakov

(10) Patent No.: US 8,748,199 B2
(45) Date of Patent: Jun. 10, 2014

(54) IN-SITU MEASUREMENT OF FEATURE DIMENSIONS

(75) Inventor: Dmytro Chumakov, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 472 days.

(21) Appl. No.: 13/092,815

(22) Filed: Apr. 22, 2011

(65) Prior Publication Data

US 2012/0270342 A1 Oct. 25, 2012

(51) Int. Cl.
*H01L 21/66* (2006.01)

(52) U.S. Cl.
USPC ........................ 438/18; 257/E21.53

(58) Field of Classification Search
USPC .................... 438/18, 14, 15, 16, 17
See application file for complete search history.

(56) References Cited

U.S. PATENT DOCUMENTS 7,132,683 B1 * 11/2006 Krishnan et al. ............... 257/40
2005/0221513 A1 * 10/2005 Yue et al. ......................... 438/14

* cited by examiner

*Primary Examiner* — Reema Patel
(74) *Attorney, Agent, or Firm* — Ingrassia Fisher & Lorenz, P.C.

(57) ABSTRACT

Methods and systems are provided for fabricating a semiconductor device. An exemplary method involves forming a feature of a semiconductor device in a first region of a layer of material on a semiconductor substrate and forming a test structure in a second region of the layer of material. The test structure is formed concurrently to forming the feature, and a dimension of the feature is determined using the test structure.

15 Claims, 4 Drawing Sheets

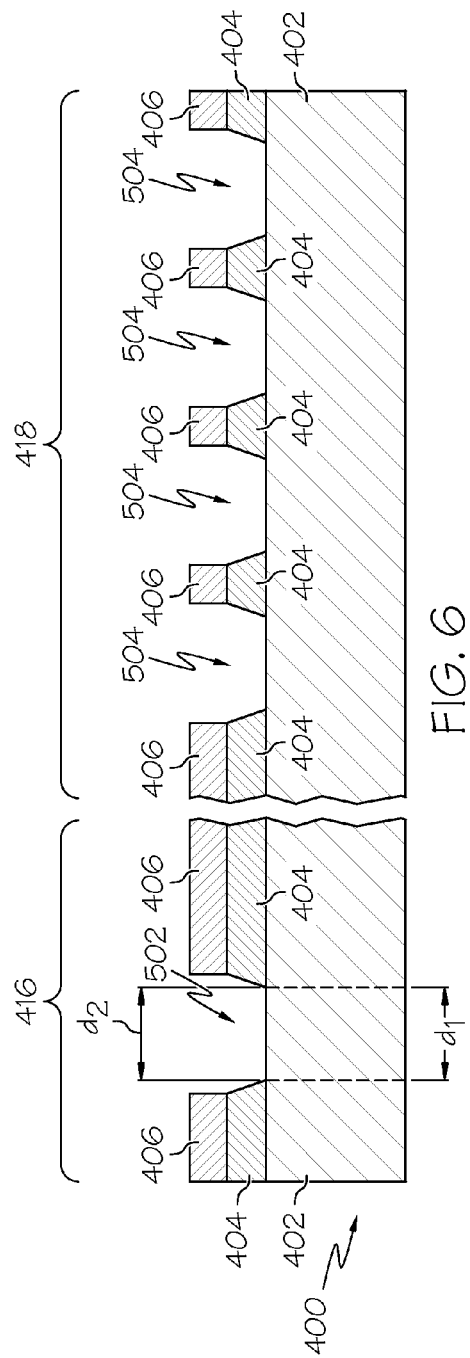
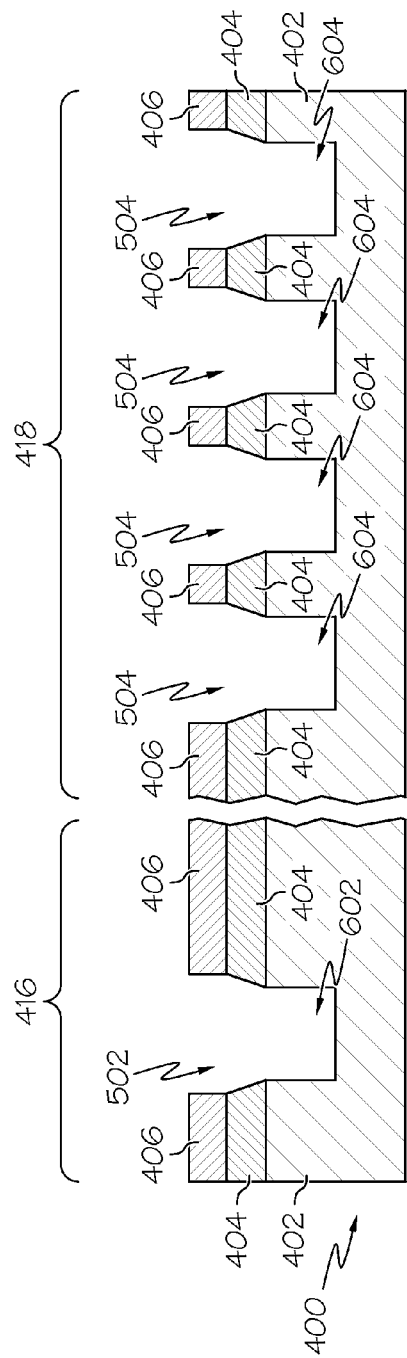

IN-SITU MEASUREMENT OF FEATURE DIMENSIONS

TECHNICAL FIELD

Embodiments of the subject matter generally relate to fabrication of semiconductor devices, and more particularly, relate to systems and methods for measuring feature dimensions in-situ.

BACKGROUND

Semiconductor devices, such as transistors, are the core building block of the vast majority of electronic devices. It is desirable to accurately and precisely fabricate transistors and other semiconductor devices with physical features having their intended physical dimensions, to thereby achieve semiconductor devices having their intended performance characteristics and improve yield. In practice, however, performance variations exist among the hardware tools used to fabricate the devices, making it difficult to produce identical devices using identical settings on each tool. For example, the settings of two different etch chambers of the same make and/or model may be configured to implement identical process conditions, but the physical dimensions of a feature etched using one chamber may be different from the physical dimensions of that same feature etched using the other chamber. Additionally, the performance characteristics of a hardware tool may change over time, which may result in feature dimensions that drift over time even though the process conditions are unchanged. As a result of the aforementioned problems, devices may be fabricated with features that deviate from their intended physical dimensions, which, in turn, may lead failures at wafer test and/or reduce yield.

BRIEF SUMMARY

A method is provided for fabricating a semiconductor device. The method involves forming a feature of a semiconductor device in a first region of a layer of material on a semiconductor substrate and forming a test structure in a second region of the layer of material. The test structure is formed concurrently to forming the feature, and a dimension of the feature is determined using the test structure.

In another embodiment, a measurement system is provided. The measurement system includes a source, a detector, and a control module. The source emits a reference signal having a reference value for a signal characteristic that is modified by a test structure on a semiconductor substrate. The detector detects the modified signal, and the control module is coupled to the detector and estimates a dimension of a feature formed on the semiconductor substrate based on a relationship between the modified value and an expected value for the signal characteristic of the modified signal. The expected value is based on the reference value and indicative of an intended dimension for the feature.

In yet another embodiment, another method is provided for fabricating a feature for a semiconductor device formed on a semiconductor substrate. The method begins by patterning a photoresist layer overlying a material layer on the semiconductor substrate to define the feature on a device region of the semiconductor substrate and a plurality of test features on a second region of the semiconductor substrate, the photoresist layer. While the semiconductor substrate is disposed in a chamber of a processing tool, the method continues by etching the material layer using the photoresist layer as an etch mask to concurrently form the feature and the test features and emitting a reference signal having a reference value for a signal characteristic from a radiation source mounted inside the chamber. The test features modify the signal characteristic of the reference signal to produce a modified signal having a modified value for the signal characteristic. The modified value for the signal characteristic is obtained from a radiation detector mounded inside the chamber, and a dimension of the feature is determined based on the modified value.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 4-7 are cross-sectional views that illustrate a semiconductor device and methods for fabricating a feature for the semiconductor device on a semiconductor substrate in conjunction with the measurement system of FIG. 1 and the dimension measurement process of FIG. 3 in accordance with one or more exemplary embodiments.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein may be utilized to measure dimensions of features formed of a semiconductor device in-situ. As described in greater detail below, a processing tool is equipped with a radiation source and a radiation detector mounted inside the processing tool. The radiation source and radiation detector are arranged such that a reference signal having known (or reference) signal characteristics emitted by the radiation source is directed towards a test structure formed on the semiconductor substrate concurrently to formation of the feature of interest on the semiconductor device, wherein the test structure modifies one or more signal characteristics to produce a modified signal having modified signal characteristics that are sensed, detected, or otherwise measured by the radiation detector. A measured value for a modified signal characteristic is compared to an expected value for the modified signal characteristic that is determined based on the known signal characteristic and the intended dimension for the feature of interest. Based on the relationship between the measured value and the expected value, the fabricated dimension of the feature of interest is estimated, and when the estimated value for the feature dimension deviates from the intended dimension by more than a threshold amount, remedial action may be taken to correct the deviation or otherwise mitigate the impact of the deviation. As a result, wafer loss may be avoided and yield may be increased.

Figure 1:
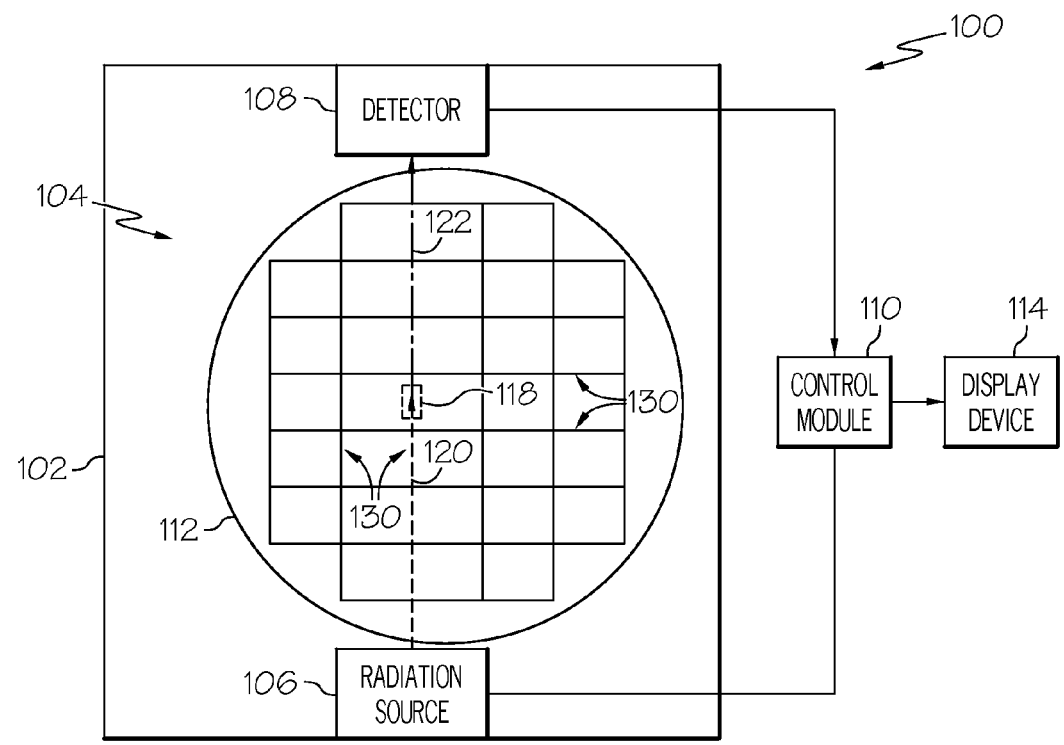
FIG. 1 is a block diagram of an exemplary embodiment of a measurement system.

FIG. 1 depicts an exemplary embodiment of a measurement system 100 that includes, without limitation, a processing tool 102 having an interior chamber 104, a radiation source 106, a radiation detector 108, a control module 110, and a display device 114. In an exemplary embodiment, a substrate 112 (or wafer) of semiconductor material (e.g., silicon or the like) is disposed within the chamber 104 of the processing tool 102, wherein the processing tool 102 executes one or more semiconductor fabrication processes while the substrate 112 is disposed inside the chamber 104 to facilitate creation of features for semiconductor devices formed on the substrate 112. As described in greater detail below, a photoresist layer is patterned and used as an etch mask to form one or more device features in a material layer on a first region 116 of the substrate 112 while concurrently forming a test structure in the material layer on a second region 118 of the substrate 112. For convenience, but without limitation, the region 118 of the substrate 112 having the test structure formed thereon may alternatively be referred to herein as a test region, and the region 116 of the substrate 112 having the one or more device features formed thereon may alternatively be referred to herein as a device region. As described in greater detail below, the radiation source 106, the radiation detector 108, and the control module 110 are cooperatively configured to utilize the test structure to estimate or otherwise determine the fabricated dimension of the one or more device features formed on the device region 116.

It should be understood that FIG. 1 is a simplified representation of the measurement system 100 for purposes of explanation and ease of description, and FIG. 1 is not intended to limit the subject matter in any way. In this regard, although the subject matter may be described herein in the context of a single test structure on a single test region 118 on the semiconductor substrate 112, in practice, multiple test structures may be formed or otherwise provided at various test regions throughout the semiconductor substrate 112 to enable multiple determinations of fabricated dimensions for device features formed thereon. Likewise, although the subject matter may be described herein in the context of a single radiation source 106 and a single radiation detector 108, in practice, the measurement system 100 may include additional radiation sources and/or radiation detectors to accommodate additional dimension measurements.

As illustrated by FIG. 1, in an exemplary embodiment, the radiation source 106 and the radiation detector 108 are each mounted on the inside of the interior chamber 104 of the processing tool 102 to accommodate estimating the dimension of the device features formed on the device region 116 in-situ, that is, without removing the patterned photoresist layer and without removing the substrate 112 from the chamber 104, as described in greater detail below. The radiation source 106 is preferably realized as one or more source(s) of electromagnetic radiation that emits electromagnetic radiation under control of the control module 110, such as, for example, a light-emitting diode (LED) or a laser. In an exemplary embodiment, the radiation source 106 emits an electromagnetic reference signal 120 having one or more known (or reference) signal characteristics (e.g., intensity, power, frequency, or the like) that is directed towards the test structure on the test region 118. As described in greater detail below, the test structure modulates or otherwise modifies one or more signal characteristics of the reference signal 120 to produce a modified signal 122 that is reflected from the test structure and sensed, measured, or otherwise received by the radiation detector 108. In accordance with one or more embodiments, the radiation source 106 is arranged or otherwise positioned within the chamber 104 such that when the semiconductor substrate 112 is placed within the chamber 104 of the processing tool 102, signals emitted by the radiation source 106 are directed towards the test region 118 without any adjustment. In other embodiments, the radiation source 106 may be capable of rotating, pivoting, or otherwise being repositioned (either electronically or manually) to direct emitted electromagnetic signals towards the test region 118.

The radiation detector 108 may be realized as a photodiode, charge-coupled device (CCD), or another photodetector that is capable of sensing, detecting, measuring, or otherwise receiving electromagnetic radiation emitted by the radiation source 106. In an exemplary embodiment, the radiation detector 108 senses, detects, measures, or otherwise receives the modified signal 122 that is reflected by the test structure on the test region 118. In this regard, in accordance with one or more embodiments, the radiation detector 108 is arranged or otherwise positioned within the chamber 104 such that when the semiconductor substrate 112 is placed within the chamber 104, signals emitted by the radiation source 106 and reflected by the test structure on the test region 118 are directed towards the radiation detector 108 without any adjustment. In other embodiments, the radiation detector 108 may be capable of rotating, pivoting, or otherwise being repositioned (either electronically or manually) to receive the modified signals 122 reflected by the test structure.

The control module 110 is communicatively coupled to the radiation source 106 and the radiation detector 108, and the control module 110 generally represents the hardware, processing logic, circuitry and/or other components of the measurement system 100 that are configured to instruct, command, or otherwise signal the radiation source 106 to emit the reference signal 120, determine the fabricated dimension of a device feature formed on the device region 116 based on the modified signal 122 received by the radiation detector 108, and perform additional tasks and/or functions associated with the operation of the measurement system 100 described in greater detail below. Depending on the embodiment, the control module 110 may be realized as a processor, a controller, a microprocessor, a microcontroller, a digital signal processor, a field programmable gate array, any suitable programmable logic device, discrete gate or transistor logic, discrete hardware components, or any combination thereof, designed to perform the functions described herein. In this regard, the steps of any method or algorithm described in connection with the embodiments disclosed herein may be embodied directly in hardware, in firmware, in a software module executed by the control module 110, or in any combination thereof. In some embodiments, the control module 110 may be integral with the processing tool 102 to control process conditions or otherwise support operation of the processing tool 102. In other embodiments, the control module 110 may be separate from a supervisory control module that controls process conditions or otherwise supports operation of the processing tool 102. The display device 114 is realized as an electronic display, such as a liquid crystal display (LCD), a light emitting diode (LED) display, or another electronic display, that is coupled to the control module 110 to provide feedback to a user or operator of the processing tool 102, as described in greater detail below.

As illustrated in FIG. 1, in an exemplary embodiment, a plurality of scribe lines 130 are formed or otherwise provided on the surface of the semiconductor substrate 112 for dicing the semiconductor substrate 112 in a conventional manner to separate device region 116 into an individual die, thereby allowing multiple semiconductor devices to be formed from the semiconductor substrate 112. In an exemplary embodiment, the test structure is formed on a scribe line 130 used to dice the semiconductor substrate 112, such that the test region 118 corresponds to the portion of a scribe line 130 having a test structure formed thereon. In this manner, the test structure is formed at or along the border of a device region 116 and does not reduce or otherwise impact the area of the substrate 112 that may be used for the device region 116.

In an exemplary embodiment, the test structure is realized as a plurality of features (alternatively referred to herein as test features) that are formed in a material layer of the semiconductor substrate 112 concurrently to forming the device feature(s) that are being measured by the measurement system 100. In this regard, the test features are arranged in a pattern, wherein the size, shape, dimension, pitch and/or spacing of the test features are chosen to allow an optical measurement technique (e.g., interferometry, scatterometry, reflectometry, or the like) to be used to determine or otherwise estimate the fabricated dimension of the device feature(s) based on the manner in which the test features modify signal characteristics of the reference signal 120 emitted by the radiation source 106. For example, as described in greater detail below, the test features may be configured to modify the intensity of the reference signal 120 in a manner that is influenced by the fabricated dimensions of the test features, which, in turn, is indicative of the fabricated dimensions of the device feature(s).

Figure 2:
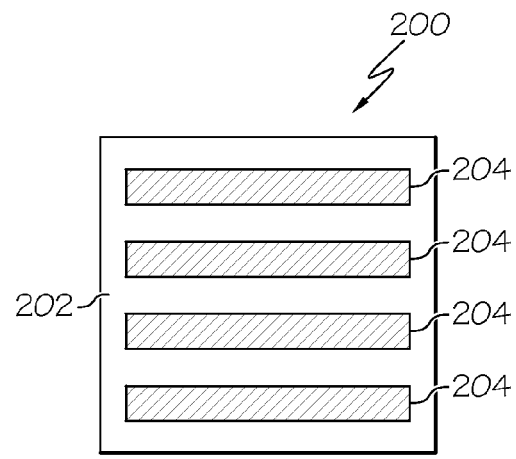
FIG. 2 is a top view diagram of a test region of a semiconductor substrate suitable for use with the measurement system of FIG. 1.

FIG. 2 depicts a top view of an exemplary test region 200 (e.g., test region 118) on a semiconductor substrate (e.g., semiconductor substrate 112) and utilized with the measurement system 100 of FIG. 1. As described in greater detail below, a photoresist layer 202 on the test region 200 is patterned to expose the underlying material layer 204, and thereby define the plurality of test features of the test structure formed in the material layer 204 in the test region 200 concurrently to the one or more device features being formed in the material layer overlying the device region of the semiconductor substrate. For example, in accordance with one embodiment, the test features are realized as an array of voided regions (or trenches) etched into the underlying material layer concurrently to etching one or more voided regions (or trenches) in the device region. As illustrated, the photoresist layer 202 is patterned to provide test features arranged in a periodic manner, that is, the spacing between neighboring test features is substantially the same throughout the test structure.

Still referring to FIGS. 1-2, as set forth above and described in greater detail below, the test features of the test structure modify one or more signal characteristics of the reference signal 120 emitted by the radiation source 106 (e.g., by reducing the signal power or intensity) to create the modified signal 122 that is reflected towards the radiation detector 108, wherein the amount by which the reference signal 120 is modified is influenced by the fabricated dimension of the test features. Thus, by virtue of the test features being formed concurrently to the device feature(s) in the device region 116 under the same process conditions, the relationship between the signal characteristics of the modified signal 122 relative to the signal characteristics of reference signal 120 is indicative of the fabricated dimension of the device feature(s) on the device region 116 formed concurrently to the test features. Accordingly, the control module 110 may estimate or otherwise determine a value for a dimension of the device feature(s) formed on the device region 116 based on the modified signal 122 received by the radiation detector 108 and compare the estimated value for the dimension of the feature(s) to the intended (or expected) value for the dimension of the feature(s) on the device region 116. In some embodiments, when the estimated value differs from the intended value, the control module 110 determines how one or more process conditions implemented by the processing tool 102 should be modified to achieve the intended value for the dimension of the feature(s). Depending on the embodiment, the control module 110 may provide such feedback to a user (e.g., by displaying such information on display device 114) and/or automatically modify the process condition settings being implemented by the processing tool 102 to achieve the intended feature dimensions.

Figure 3:
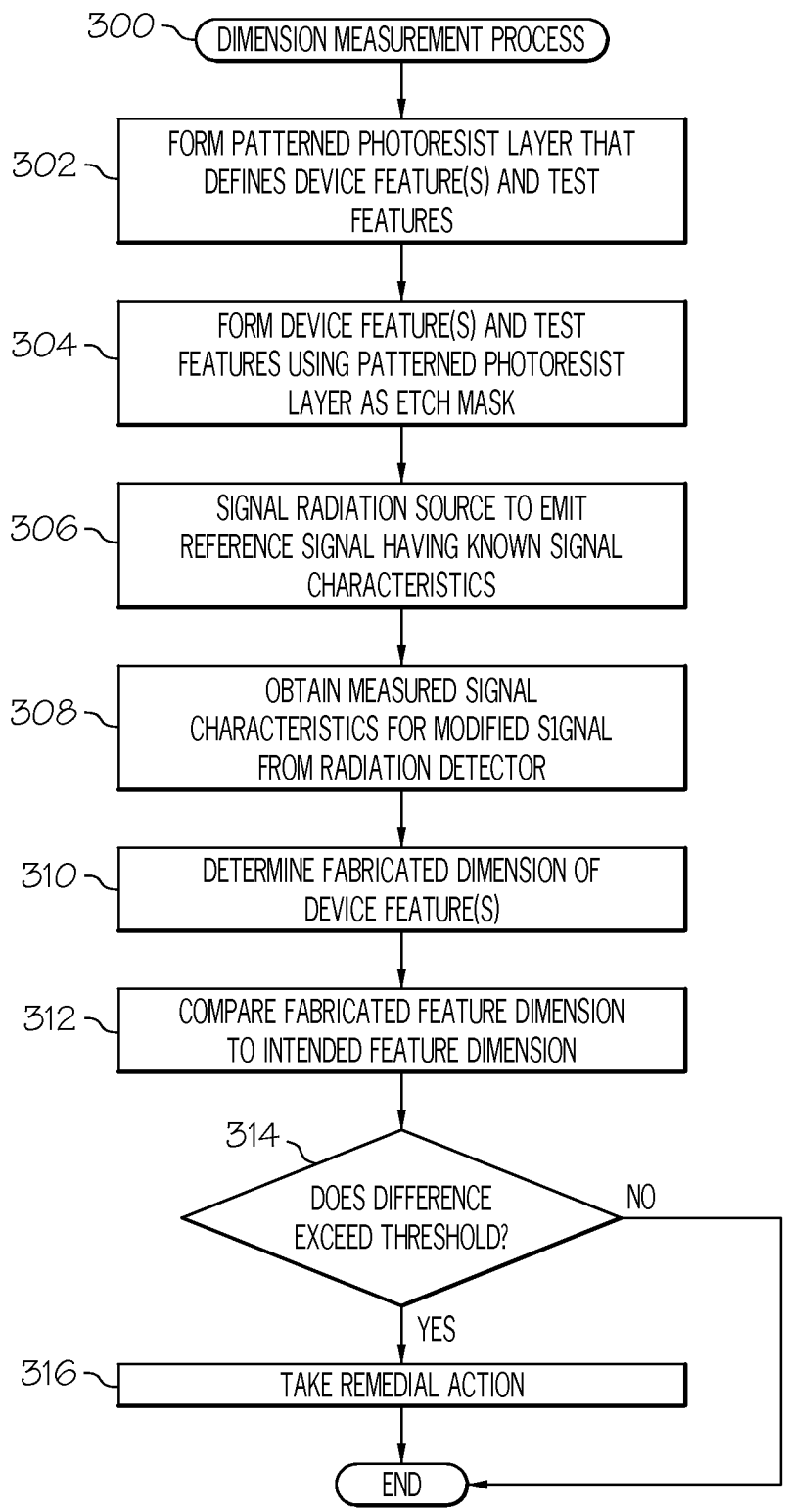
FIG. 3 is a flow diagram of an exemplary dimension measurement process suitable for use with the measurement system of FIG. 1 in accordance with one or more embodiments.

Referring now to FIG. 3, in an exemplary embodiment, a measurement system is configured to perform a dimension measurement process 300 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the radiation source 106, the radiation detector 108, and/or the control module 110. It should be appreciated that the dimension measurement process 300 may include any number of additional or alternative tasks, the tasks need not be performed in the illustrated order and/or the tasks may be performed concurrently, and/or the dimension measurement process 300 may be incorporated into a more comprehensive procedure or process having additional functionality not described in detail herein. Moreover, one or more of the tasks shown and described in the context of FIG. 3 could be omitted from an embodiment of the respective process as long as the intended overall functionality remains intact.

Figure 4:
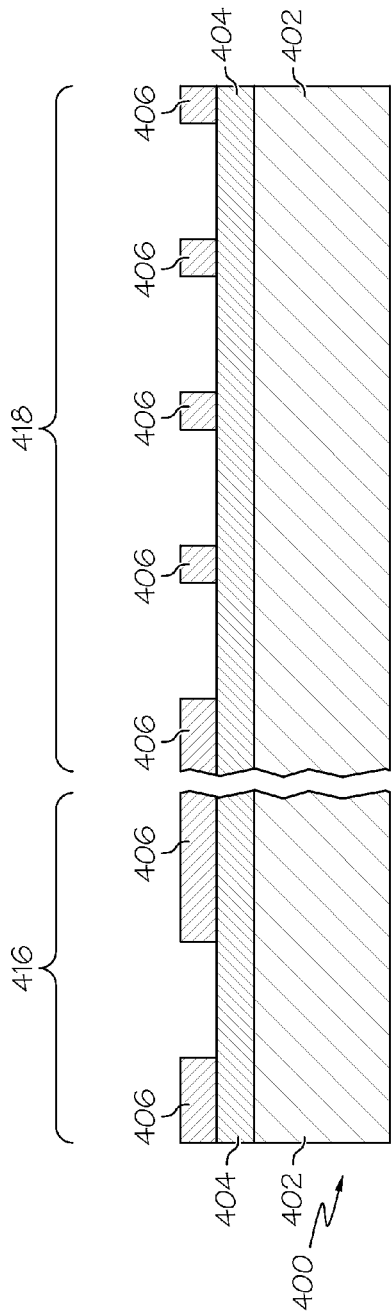

In an exemplary embodiment, the dimension measurement process 300 begins by forming a patterned photoresist layer to define one or more feature(s) for a semiconductor device to be formed on the device region(s) of the semiconductor substrate and the test features to be formed on the test region of the semiconductor substrate (task 302). In this regard, a layer of photoresist material is deposited overlying the semiconductor substrate, and a pattern or image provided on a reticle corresponding to the device feature(s) and test features is transferred to the photoresist layer using conventional photolithography process steps. FIG. 4 illustrates a cross-sectional view of an exemplary semiconductor substrate 400 (e.g., semiconductor substrate 112) after forming a patterned photoresist layer 406. As illustrated, the semiconductor substrate 400 includes a layer of a first material 402 (or alternatively, the first material layer), and a layer of a second material 404 (or alternatively, the second material layer) disposed overlying the first material layer 402. Depending on the embodiment, the first material 402 may be realized as a semiconductor material (e.g., silicon or the like), a dielectric material (e.g., an oxide material, a nitride material, or the like), or a conductive material (e.g., a metal material, or the like). The second material 404 is different from the first material 402, and depending on the embodiment, the second material 404 may be realized as a semiconductor material, a dielectric material, or a conductive material that is deposited, grown, or otherwise formed overlying the first material layer 402 in a conventional manner. In accordance with one or more embodiments, the second material 404 may be realized as an antireflective material, such as silicon oxynitride, that is utilized for improving the patterning of the photoresist material 406, and as described in greater detail below, the antireflective material may be etched to form features in the antireflective material layer that define a dimension of device features subsequently formed in the underlying material layer 402. After forming the second material layer 404, the layer of photoresist material 406 is formed overlying the second material layer 404 and patterned to expose a portion of the second material layer 404 on the device region 416 to define a device feature to be formed in the second material layer 404 and/or first material layer 402. At the same time, the photoresist layer 406 is patterned to expose portions of the second material layer 404 on the test region 418 to define the test features to be formed concurrently to the device feature.

Figure 5:
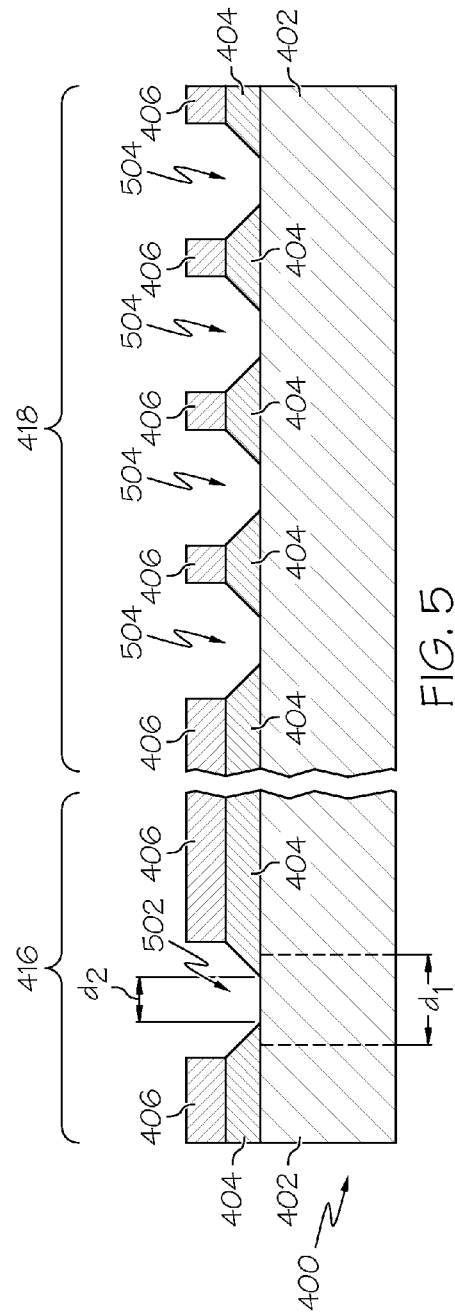

Referring again to FIG. 3, and with continued reference to FIGS. 1 and 4, after forming the patterned photoresist layer, in an exemplary embodiment, the dimension measurement process 300 continues by concurrently forming the device feature(s) and test structures defined by the patterned photoresist layer by using the patterned photoresist layer as an etch mask (task 304). In this regard, the control module 110 may command, instruct, or otherwise operate the processing tool 102 to perform one or more etch process steps in accordance with predefined process conditions (e.g., temperature, pressure, accelerating voltage, and the like) for a predetermined time period chosen to result in the device feature(s) formed on the device region 116 having the intended (or desired) dimension. FIG. 5 illustrates a cross-sectional view of the semiconductor substrate 400 after etching the second material layer 404 for a predetermined time period using the patterned photoresist layer 406 as an etch mask to form a voided region (or trench feature) 502 in the device region 416. Voided test features 504 are concurrently formed in the test region 418 of the second material layer 404 while etching the device region 416 of the second material layer 404 to form voided feature 502. The voided test features 504 function as the test structure on the test region 418, and for convenience, the plurality of voided test features 504 may be collectively referred to herein as the test structure. As described in greater detail below, the voided feature 502 in the second material layer 404 also corresponds to a voided feature subsequently formed in the underlying material layer 402, wherein the predetermined time period for etching the second material layer 404 is chosen to provide the voided feature 502 having an intended (or desired) width of $d_1$ that corresponds to the intended width for the subsequently formed voided feature in the underlying material layer 402. However, as illustrated in FIG. 5, in accordance with one or more embodiments, implementing the predefined process conditions for the predetermined time period using the processing tool 102 may result in the voided feature 502 having a fabricated width of $d_2$ that is less than the intended width of $d_1$.

Referring again to FIG. 3, and with continued reference to FIGS. 1 and 4-5, in an exemplary embodiment, the dimension measurement process 300 continues by commanding, instructing, or otherwise signaling the radiation source to emit a reference signal having known (or reference) signal characteristics, obtaining measured signal characteristics for the modified signal from the radiation detector, and determining the fabricated dimension of the device feature(s) formed on the device region (tasks 306, 308, 310). For example, after etching the second material layer 404 for the predetermined time period chosen to provide the voided feature 502 having an intended (or desired) width of $d_1$, the control module 110 may command, instruct, signal, or otherwise control the processing tool 102 to pause or otherwise stop the etch process before commanding, instructing, or otherwise signaling the radiation source 106 to emit one or more reference signals 120 having known signal characteristics that are directed towards the test region 118, 418. As described above, the test structure 504 modifies or otherwise alters one or more signal characteristics of the reference signal(s) 120 to produce a modified signal 122 that is reflected or otherwise directed towards the radiation detector 108. In this regard, the test structure 504 modifies the signal characteristic(s) of the reference signal(s) 120 in a manner that is influenced by the fabricated width and/or depth of the test features 504, and thus, is indicative of the fabricated width and/or depth of the voided feature 502 by virtue of being formed concurrently thereto. The radiation detector 108 senses, detects, or otherwise measures the modified signal characteristic(s) of the modified signal 122, and the control module 110 obtains or otherwise receives measured values for the modified signal characteristic(s) from the radiation detector 108. Based on measured values for the modified signal characteristic(s), the control module 110 calculates or otherwise determines an estimated value for the fabricated dimension of the voided feature 502 on the device region 116, 416. For example, the reference signal 120 may have a known reference intensity value, wherein the control module 110 obtains a measured intensity value for the modified signal 122 and calculates an estimated value for the fabricated width ($d_{est}$) of the voided feature 502 based on the relationship between the measured intensity value for the modified signal 122 to an expected intensity value for the modified signal 122. In this regard, the expected intensity value corresponds to the expected (or theoretical) intensity of the modified signal 122 that would be received when reference signal 120 is modified by test features 504 having a fabricated width equal to the expected width of the test features 504 when the fabricated width of the voided feature 502 is equal to the intended width. In other words, the measured intensity value will be equal to the expected intensity value when the actual width of the voided feature 502 is equal to the intended width (e.g., $d_2=d_1$). Thus, the estimated value for the fabricated width of the voided feature 502 determined by the control module 110 is substantially equal to the fabricated width of the voided feature 502 ($d_{est}=d_2$).

In an exemplary embodiment, after estimating the fabricated dimension of the device feature(s) formed on the device region, the dimension measurement process 300 continues by comparing the estimated value for the fabricated feature dimension to the intended (or desired) value for the feature dimension and determining whether a difference between the estimated feature dimension and the intended feature dimension exceeds a threshold value (tasks 312, 314). For example, the control module 110 may subtract the estimated width of the voided feature 502 (which is substantially equal to $d_2$ as described above) from the intended width of the voided feature 502 ($d_1$) to obtain the difference between the intended width and the estimated width, and compare the difference value to a threshold value ($d_{th}$) chosen such that when the difference between the intended width and the estimated width is less than the threshold value (e.g., $d_1-d_2<d_{th}$), the fabricated width of the voided feature 502 is within specification. In this regard, when the difference between the intended width and the estimated width is less than the threshold value, the dimension measurement process 300 exits and fabrication of the substrate 112, 400 continues in the desired manner. For example, as described in greater detail below in the context of FIG. 7, the voided feature 502 may be used to form an additional voided feature having the intended width.

Still referring to FIG. 3, and with continued reference to FIG. 1 and FIGS. 4-5, in an exemplary embodiment, when the difference between the intended feature dimension and the estimated fabricated feature dimension is greater than the threshold value (e.g., $d_1-d_2>d_{th}$), the dimension measurement process 300 continues by taking one or more remedial actions (task 316). In accordance with one or more embodiments, when the estimated dimension is less than the intended dimension, the control module 110 determines an etch rate for the material layer being etched, determines an additional duration of time for etching the material layer based on that etch rate, and commands, instructs, or otherwise signals the processing tool 102 to etch the material layer the additional time period to obtain the device feature(s) in the material layer having the intended dimension. For example, the control module 110 may calculate or otherwise determine the observed etch rate for the second material layer 404 based on the estimated fabricated width of the voided feature 502 and the amount of time that the second material layer 404 was etched for to obtain the voided feature 502 (e.g., the predetermined time period chosen to provide the intended width). Using the observed etch rate for the second material layer 404, the control module 110 calculates or otherwise determines an additional time period for etching the second material layer 404 based on the difference between the intended width of the voided feature 502 and the estimated width of the voided feature 502 (e.g., $d_1-d_2$). In this regard, the additional time period corresponds to the amount of time needed to etch the second material layer 404 by an amount substantially equal to the difference between the intended width of the voided feature 502 and the estimated width of the voided feature 502 using the previously utilized etch process conditions. In various embodiments, the control module 110 may provide feedback to a user regarding the amount of additional time that the etch process steps should be increased (e.g., by displaying the additional time period on a display device 114) or update its settings for future wafers, such that the etch process is performed for an amount of time corresponding to the sum of the initial predetermined time period and the additional time period calculated based on the observed etch rate. In this manner, the measurement system 100 and/or dimension measurement process 300 compensates for characteristics of the processing tool 102 to ensure device features are fabricated within specification.

For example, referring to FIGS. 4-6, and with continued reference to FIG. 1 and FIG. 3, in an exemplary embodiment, the control module 110 commands, instructs, or otherwise operates the processing tool 102 to perform the etch process step for the additional time period calculated based on the observed etch rate using the previously defined process conditions (e.g., temperature, pressure, accelerating voltage, and the like) to increase the width of the voided feature 502. In this regard, by virtue of the control module 110 and/or dimension measurement process 300 estimating the dimension of the device feature(s) in-situ without removing the photoresist material 406, removing the substrate 112, 400 from the chamber 104, or otherwise interfering with the chamber 104 of the processing tool 102, the patterned photoresist layer 406 remains intact and may be reused as an etch mask while performing the additional etching to increase the width of the voided feature 502. After etching for the additional time period, the control module 110 commands or otherwise signals the processing tool 102 such that the etch process is stopped, and repeats the steps of signaling the radiation source 106 to emit a reference signal 120, obtaining measured signal characteristics for the modified signal 122 from the radiation detector 108, and estimating the fabricated width of the voided feature 502 in a similar manner as described above (e.g., tasks 306, 308, 310). As illustrated in FIG. 6, in an exemplary embodiment, etching the second material layer 404 for the additional time period calculated based on observed etch rate results in the width of the voided feature 502 being increased, such that the fabricated width of the voided feature 502 is substantially equal to the intended width for the voided feature 502. As described above, when the fabricated width of the voided feature 502 is substantially equal to the intended width for the voided feature 502 (e.g., $d_2=d_1$), the test features 504 produce the modified signal 122 having a measured intensity value that is substantially equal to the expected intensity value when the fabricated widths of the test features 504 are indicative of the fabricated width of the voided feature 502 being equal to its intended width.

Referring now to FIG. 7, and with continued reference to FIGS. 1 and 3-6, as described above, once the difference between the intended width and the estimated fabricated width is less than the threshold value, the dimension measurement process 300 exits and fabrication of the substrate 112, 400 continues in the desired manner. For example, as illustrated, fabrication of the substrate 400 may continue by etching the first material layer 402 using the patterned second material layer 404 as an etch mask, such that the width of the voided feature 502 formed in the device region 116, 416 defines the width of a voided feature (or trench feature) 602 formed in the first material layer 402. As illustrated, etching the first material layer 402 using the patterned second material layer 404 as an etch mask results in trench features 604 being concurrently formed in the test region 418. In this regard, the dimension measurement process 300 described above may be repeated to estimate a fabricated dimension (e.g., a width and/or depth) of the trench feature 602 using the trench features 604 on the test region 418 and modify the etch process as needed to obtain a trench feature 602 on the device region 416 having the intended dimensions in a similar manner as set forth above with respect to the voided feature 502.

Referring again to FIG. 3, in accordance with one or more embodiments, when the estimated fabricated dimension is greater than the intended dimension by more than the threshold amount, the control module 110 may notify the user, for example, by displaying the estimated fabricated dimension and/or the difference between the estimated fabricated dimension and the intended dimension on the display device 114. In such embodiments, the control module 110 may instruct or otherwise operate the processing tool 102 such that no further process steps are undertaken until the control module 110 receives feedback from the user regarding subsequent fabrication process steps. In this regard, the user may modify process conditions for subsequent process steps to remedy the difference such that the wafer is within specification at the end of fabrication. For example, referring again to FIG. 5, when the voided feature 502 in the second material layer 404 is used to define a feature that is subsequently etched into the underlying material layer 402, the user may modify the process conditions used when etching the underlying material layer 402 to ensure the feature formed therein has its intended dimension (or is within a threshold value thereof) even though the fabricated of the voided feature 502 may be too large. In this regard, the second material layer 404 may be removed during subsequent process steps, such that the features of the completed semiconductor device have their intended feature dimensions and are within specification even though the voided feature 502 in the second material layer 404 may not have been.

Still referring to FIG. 3, and with continued reference to FIGS. 1 and 4-6, it should be noted that although the subject matter is described herein in the context of the feature dimensions being estimated at discrete times (e.g., at the end of an etch process step), in practice, the feature dimensions may be estimated in a continuous manner. For example, while the processing tool 102 is implementing the etch process conditions to etch the second material layer 404, the control module 110 may signal the radiation source 106 to continuously emit reference signals 120 having known signal characteristics, obtain measured signal characteristics for the modified signals 122 produced by the test structure 504 on the test region 118, 418 from the radiation detector 108, and repeatedly and/or continuously estimate the fabricated width of the voided feature 502 (e.g., tasks 306, 308, 310). In this regard, once the control module 110 determines an estimated value for the fabricated width of the voided feature 502 that is substantially equal to the intended width of the voided feature 502, the control module 110 may command, instruct, or otherwise signal the processing tool 102 to cease implementing the etch process conditions, and fabrication of the substrate 112, 400 may then continue in the desired manner.

To briefly summarize, one advantage of the systems and methods described herein is that any critical dimensions for features formed on a semiconductor substrate may be estimated or otherwise measured in-situ, thereby providing instant feedback regarding the performance characteristics of the processing tool being used and the efficacy of the process conditions being implemented by the processing tool, and at the same time allowing for remedial actions to be undertaken to correct feature dimensions to ensure they are within specification. By ensuring that feature dimensions are within specification in-situ, wafer loss may be reduced, thereby improving yield.

For the sake of brevity, conventional techniques related to semiconductor fabrication processes, interferometry, reflectometry, and/or other optical measurement techniques, signaling, and other functional aspects of the subject matter may not be described in detail herein. Furthermore, the connecting lines shown in the various figures contained herein are intended to represent exemplary functional relationships and/or physical couplings between the various elements, and it should be noted that many alternative or additional functional relationships or physical connections may be present in a practical embodiment of the subject matter. Thus, although the figures may depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a semiconductor device comprising:
    forming a feature of the semiconductor device in a first region of a layer of material on a semiconductor substrate;
    forming a test structure in a second region of the layer, the test structure being formed concurrently to forming the feature; and
    determining a dimension of the feature using the test structure, wherein determining the dimension comprises:
        signaling a source to emit a reference signal, the test structure modifying the reference signal to produce a modulated signal; and
        estimating the dimension of the feature based on the modulated signal.

2. The method of claim 1, further comprising obtaining a measured value for a signal characteristic of the modulated signal from a detector inside a chamber having the semiconductor substrate disposed therein, the source being inside the chamber, wherein the dimension of the feature is estimated based on the measured value.

3. The method of claim 1, further comprising etching the layer of material using a patterned photoresist layer overlying the layer as an etch mask to concurrently form the feature in the first region and the test structure in the second region.

4. The method of claim 3, wherein:
    etching the layer comprises etching the layer for a first time period; and
    determining the dimension of the feature comprises estimating a fabricated dimension of the feature after etching the layer for the first time period.

5. The method of claim 4, estimating the fabricated dimension resulting in an estimated value for the fabricated dimension, wherein the method further comprises etching the layer for a second time period after estimating the fabricated dimension of the feature when the estimated value is less than an intended dimension for the feature.

6. The method of claim 5, further comprising determining the second time period based on a difference between the estimated value and the intended dimension.

7. The method of claim 6, further comprising determining an etch rate for the layer based on the estimated value and the first time period, wherein the second time period is determined based on the etch rate and the difference between the estimated value and the intended dimension.

8. The method of claim 1, the layer of material comprising an antireflective material layer, wherein the method further comprises etching the antireflective material layer using a patterned photoresist layer overlying the antireflective material layer as an etch mask to concurrently form the feature in the first region of the antireflective material layer and the test structure in the second region of the antireflective material layer.

9. A method for fabricating a semiconductor device comprising:
    forming a feature of the semiconductor device in a first region of a layer of material on a semiconductor substrate;
    forming a test structure in a second region of the layer, the test structure being formed concurrently to forming the feature; and
    determining a dimension of the feature using the test structure, wherein:
        forming the feature comprises etching a voided feature in the first region;

forming the test structure comprises etching an array of voided features in the second region concurrently to etching the voided feature in the first region; and determining the dimension comprises determining an estimated value for a dimension of the voided feature in the first region using the array.

10. The method of claim 9, further comprising:

comparing the estimated value to an intended value for the dimension of the voided feature; and etching the first region to increase the dimension of the voided feature when the estimated value is less than the intended value.

11. The method of claim 9, further comprising:

comparing the estimated value to an intended value for the dimension of the voided feature; and etching the first region of a second material layer using the layer of material as an etch mask to form a second feature in the second material layer, the second material layer underlying the layer of material, wherein the voided feature defines a dimension of the second feature.

12. The method of claim 9, wherein:

etching the voided feature and etching the array are performed while the semiconductor substrate is disposed in a chamber; and determining the dimension comprises:

signaling a source disposed in the chamber to emit a reference signal having a known signal characteristic, the array modifying the known signal characteristic of the reference signal resulting in a modulated signal having a modified signal characteristic;

obtaining a measured value for the modified signal characteristic from a detector disposed in the chamber; and determining the estimated value for the dimension of the feature based on the measured value.

13. The method of claim 12, the reference signal having a reference intensity value, the array modifying an intensity of the reference signal, wherein:

obtaining the measured value comprises obtaining a measured intensity value of the modulated signal; and determining the dimension comprises:

determining an expected intensity value for the modulated signal based on the reference intensity value and an intended dimension for the voided feature in the first region; and determining the estimated value based on a relationship between the measured intensity value and the expected intensity value.

14. A method for fabricating a feature for a semiconductor device formed on a semiconductor substrate, the method comprising:

patterning a photoresist layer to define the feature on a device region of the semiconductor substrate and a plurality of test features on a second region of the semiconductor substrate, the photoresist layer overlying a material layer on the semiconductor substrate; and while the semiconductor substrate is disposed in a chamber of a processing tool:

etching the material layer using the photoresist layer as an etch mask to concurrently form the feature and the plurality of test features;

emitting a reference signal having a reference value for a signal characteristic from a radiation source mounted inside the chamber, wherein the plurality of test features modify the signal characteristic of the reference signal to produce a modified signal having a modified value for the signal characteristic;

obtaining the modified value for the signal characteristic from a radiation detector mounted inside the chamber; and determining a dimension of the feature based on the modified value.

15. The method of claim 14, wherein determining the dimension comprises:

determining an expected value for the signal characteristic of the modified signal based on the reference value and an intended dimension for the feature; and estimating the dimension based on a relationship between the modified value and the expected value.

* * * * *